United States Patent [19]

Scheingold et al.

[11] 4,052,118

[45] Oct. 4, 1977

[54] CONTACT CARRYING SPRING MEMBER

[75] Inventors: William Samuel Scheingold, Palmyra; Frank Christian Youngfleish, Harrisburg, both of Pa.

[73] Assignee: AMP Incorporated, Harrisburg, Pa.

[21] Appl. No.: 729,547

[22] Filed: Oct. 4, 1976

Related U.S. Application Data

[63] Continuation-in-part of Ser. No. 582,315, May 30, 1975, abandoned.

[51] Int. Cl.² ............................................. H05K 1/12
[52] U.S. Cl. ................................................. 339/17 CF
[58] Field of Search ............ 339/17 C, 17 CF, 75 M, 339/75 MP, 176 M, 176 MP

[56] References Cited

U.S. PATENT DOCUMENTS

| | | | |
|---|---|---|---|
| 3,846,737 | 11/1974 | Spaulding | 339/17 CF |
| 3,877,064 | 4/1975 | Scheingold et al. | 339/17 CF |
| 3,955,867 | 5/1976 | Braun et al. | 339/17 CF |

*Primary Examiner*—Roy Lake
*Assistant Examiner*—Neal Abrams
*Attorney, Agent, or Firm*—William J. Keating; Allan B. Osborne

[57] ABSTRACT

The present invention relates to spring members positioned in an insulated housing for providing an electrical path from leadless integrated circuit package to a printed circuit board. More particularly the spring members are uniquely constructed in a complex geometric shape to exert forces on contact mating surfaces within closely specified maximum and minimum values and not distort the housing or the printed circuit board.

3 Claims, 4 Drawing Figures

CONTACT CARRYING SPRING MEMBER

RELATED APPLICATIONS

This application is a continuation-in-part of copending application Ser. No. 582,315, filed May 30, 1975, and now abandoned.

BACKGROUND OF THE INVENTION

Requirements for connecting devices to electrically connecting leadless integrated circuit packages to a printed circuit board employed in computers are often times conflicting. For example, the forces required to attach the package to the device must not be high enough to cause distortion of the device and the board. On the other hand, the forces exerted against the spring members in the devices must be high enough to maintain electrical contact, with non-noble plating on the contacts, in hostile industrial atmospheres. Horizontal forces must not distort the package-containing device.

With the dimensions of the circuit paths and contact-carrying spring members being measured in thousandths of an inch, alignment problems of the integrated circuit package in the connecting device and alignment of the device onto the printed circuit board becomes important considerations.

Accordingly, it is an object of the present invention to provide a contact-carrying spring member for connecting leadless integrated circuit packages to a printed circuit board wherein the forces exerted by the spring members are high enough to effect good electrical characteristics but are low enough so as not to physically distort the device or board.

DESCRIPTION OF THE PREFERRED EMBODIMENT

Figure 1:
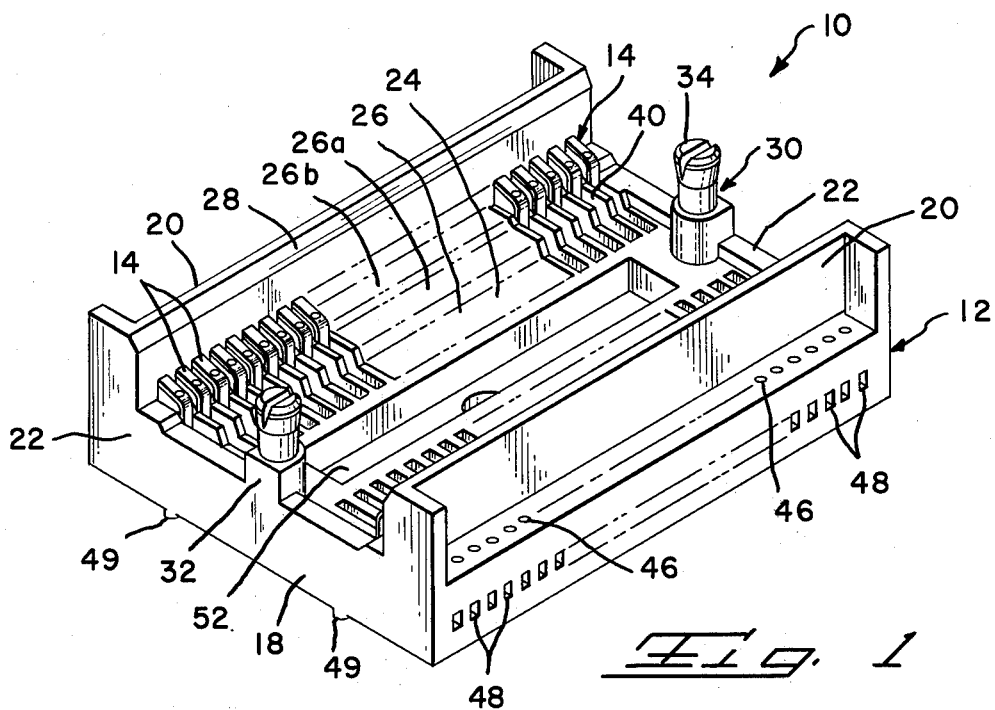
FIG. 1 is a perspective view of connecting device housing a contact-carrying spring member constructed in accordance with the present invention.
Figure 2:
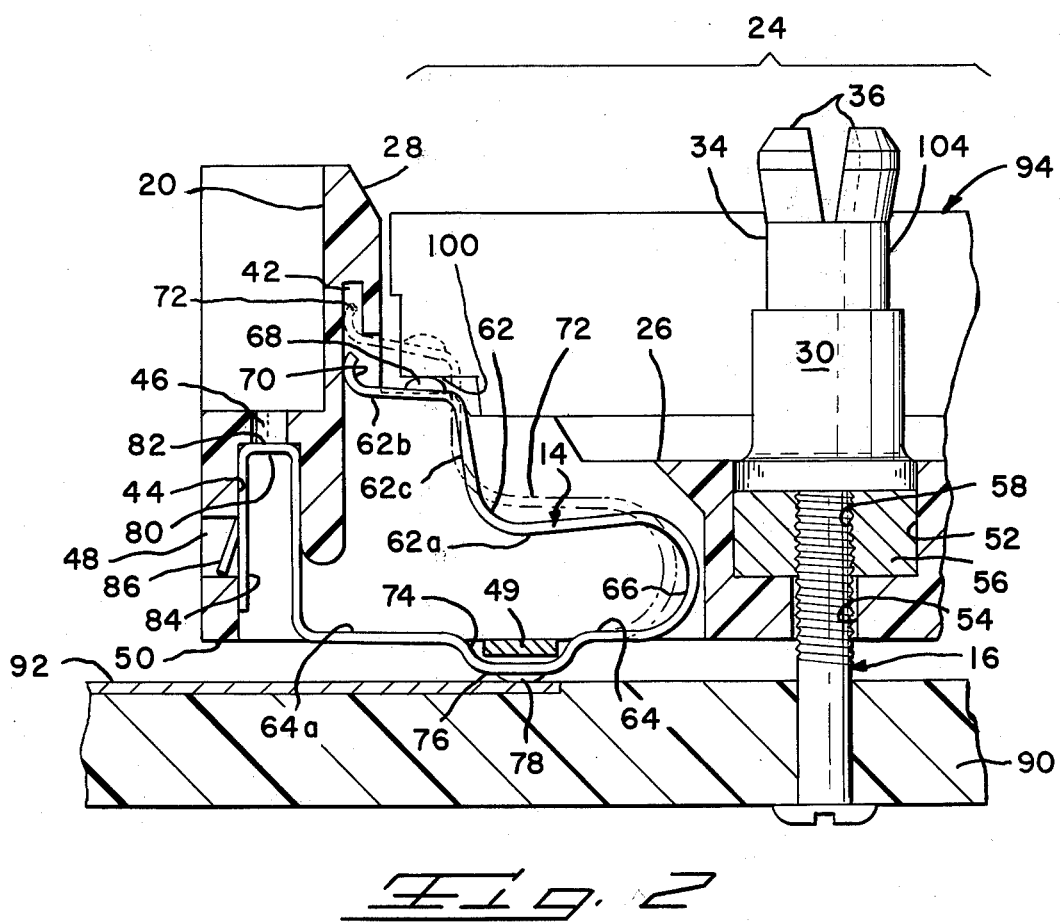
FIG. 2 is a cross-sectional view across a portion of the device of FIG. 1 showing the details of a cavity and the spring member contained therein.

With reference to FIGS. 1 and 2, connecting device 10 consists of housing 12, contact-carrying spring members 14 and attachment means 16 (FIG. 2).

Housing 12 is a one piece molding, using glass filled phenylene-oxide as a preferred material. Other nonconductive material may also be used as well as other manufacturing methods in lieu of molding. Generally the housing has a base 18, two sidewalls 20 and two endwalls 22. The base, sidewalls and endwalls define a central receiving area 24. This area includes floor 26 which extends to the sidewalls in a series of steps 26a and 26b. The top of each sidewall 20 is beveled on the inside as indicated by reference numeral 28.

Each endwall 22 has an alignment means 30 located in the middle; i.e., equal distance from each sidewall. The alignment means 30 include as integral parts thereof a column 32 and an alignment pin 34. The top portion of pin 34 is preferably molded in the fashion shown; i.e., bisected into arms 36. These arms have a degree of resiliency which permits them to be squeezed together.

Housing 12 contains two facing rows of cavities 40, each row spaced along the long sides of the central receiving area 24. These cavities extend from near the center of the central receiving area to near the outside surface of the sidewalls. Further, they are opened both at the top and bottom of base 10 except for the very upper part which is notched upwardly inside sidewall 20 as indicated by reference numeral 42. The lower outside terminus of each cavity is a vertical slot 44 in the base number 18. The slot contains a vertical test probe opening 46 and a lateral contact release opening 48. As the figures show, walls 20 are recessed inwardly relative to base 18 to provide access for the vertical test probe openings 46.

Each transverse wall defining a cavity side has a bar 49 extending down below the bottom surface 50 of base member 18.

An elongated groove 52, opening upwardly, is located down the middle of floor 26. A bore 54 extending from the bottom surface 50 of base number 18 opens into the groove at the center of the central receiving area. A metal bar 56 (FIG. 2) being of the approximate length of the groove fits thereinto and has a threaded opening 58 located therein so as to be in alignment with the aforementioned bore 54.

Each cavity contains a dual contact-carrying spring member 14 formed from a conductive material such as heat-treated beryllium copper. As seen from the side in FIG. 2, the spring member has a complex configuration. Basically it has two beams, upper beam 62 and lower beam 64, joined by bight 66. The upper beam is formed into two horizontal sections, 62a and 62b, joined by a vertical section 62c. An upper contact 68, which may be a dimple pushed out of the spring member of a deposit of material, is carried on horizontal section 62b.

Lower beam 64 has an elongated horizontal section 64a with a symmetrical downwardly projecting jog 74. The jog has a short horizontal portion 76 on which is located lower contact 78. As with upper contact 68, contact 78 may be a dimple formed from the spring member or it may be a deposit of a conductive contact material such as tin. The free end of lower beam 64 is bent into an upside down squarish "U" shaped end 80. The base 82 of end 80 bears against test probe opening 46 in housing 12. The outside leg 84 of end 80 contains an outwardly projecting oblique tine 86 which fits into release opening 48.

Contact-carrying spring members 14 are positioned in cavities 40 as shown by the dashed lines in part and solid lines in part in FIG. 2. The dashed lines, as mentioned above, represent the position of a non-loaded spring member. Jog 74 extends below bar 49 in a non-compressed condition.

Device 10 is secured to printed circuit board 90 by means of bolt 16 which extends through the board and into threaded engagement with bar 56. With bolt 16 tightened down lower contacts 78 bear against the printed circuit 92 deposited or otherwise located on the board. Bar 49 acts as a stop to maintain the bottom of housing 12 at a fixed height above the printed circuit board in order to provide drainage clearance for cleaning solutions.

Figure 3:
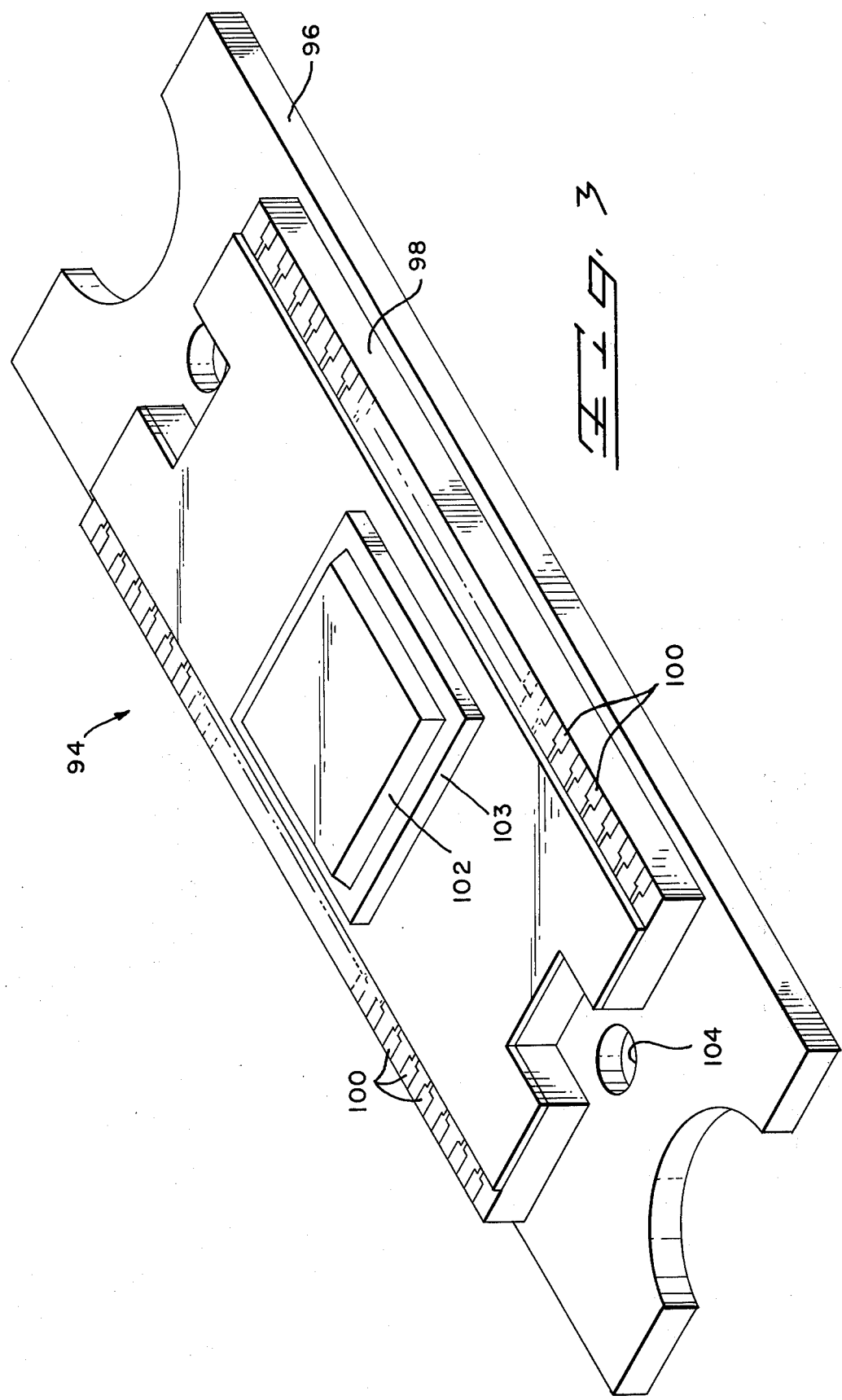
FIG. 3 is a perspective view of a leadless integrated circuit package.

Housing 12 receives a leadless integrated circuit package 94 in its central receiving area 24. The package, illustrated in FIG. 3, consists of a heat sink 96, a ceramic substrate 98 having circuit pads 100 on each side, and a cover assembly 102 inside of which is the integrated circuit chip (not shown) resting on chip holder 103.

Each end of the package contains a hole 104 through which alignment pins 34 slip. Bisected arms 36 hold the package down into contact with spring members 14 until a clamp (not shown) secures the package in place.

Returning to FIG. 2, the positioning of package 94 into the central receiving area 24 provides a visible picture of how multidirectional wiping action between contacts 68 and circuit pads 100 occur. As the package is pressed down onto contact-carrying members 14 the members move from their non-load position illustrated by the dashed lines to the loaded position illustrated by the solid lines. This movement is both vertical and rotational as can be seen by comparing the angle (relative to the horizontal) of the dashed outline of upper beam section 62b with the solid outline of the same section under the load. As the section moves the contact 68 wipes against a pad 100 in a lateral direction and simultaneously rotates about over a short arc. FIG. 2 also shows that continuous high pressure is being exerted on circuit pads 92 and 100 by the spring members 14. This continuous high pressure permits the use of non-noble material such as tin as contact material as such pressure enables the contact to break through the products of environmental and fretting corrosion, allows for thermal expansion and contraction and excuses manufacturing tolerances.

Spring members 14 may be released from cavities 40 by inserting a small screwdriver (not shown) into opening 48 and pushing leg 84 inwardly to back tine 86 out.

The spring member configuration shown and having the following dimensions:

| | | |
|---|---|---|
| Overall height: | .42 | inches |
| Active electrical length: | .59 | inches |
| Overall width: | .25 | inches |
| Average metal thickness: | 0.010 | inches | results in the following forces under maximum deflection:

| | |
|---|---|
| Upper normal: | 250 grams |
| Tangential: | 45 grams |
| Lower normal: | 300 grams |

These forces are entirely within acceptable limits and as pointed out above, provide optimum operating requirements.

As noted above the metal thickness averages about 0.010 inches. More specifically the beams 62 and 64 are in the main about 0.006 inches thick while the bight 66 is 0.011.

Figure 4:
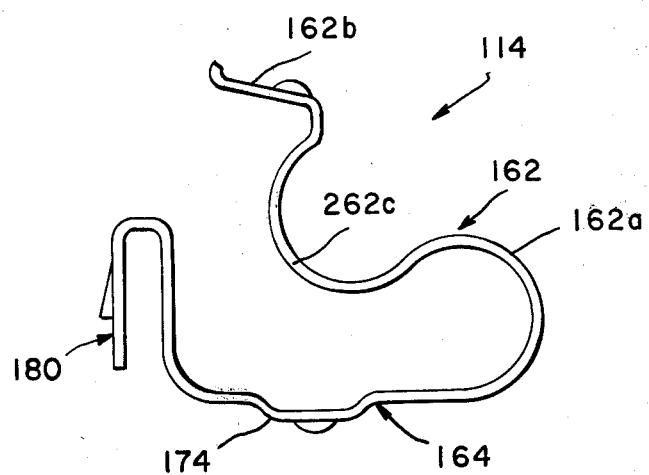
FIG. 4 illustrates another embodiment of a contact-carrying spring member.

With reference to FIG. 4, contact-carrying spring member 114 represent another embodiment of the present invention. Features identical between spring members 14 and 114 carry the same reference numerals plus 100 while changed features are indicated by the same reference numerals plus 200.

The upper beam 162 has been lengthened relative to spring member 14 by the addition of a loop section 262c intermediate horizontal sections 162a and 162b. This loop which has a radii of about 0.061, loop section, increases the length of the upper beam by a factor of 1.8. As a result the compliance of the upper beam has been increased to where the upper normal maximum deflection force is 207 grams.

Lower beam 164 has been changed in that jog 174 is closer toward the U-shaped end 180.

In addition to the obvious novelties of this device, there are others not so apparent. For example, the upper contact-carrying member, and more particularly the contact 68 itself, is completely restrained against lateral movement under no-load or pre-load conditions. Under load conditions it is partially restrained to prevent interference with probing. The curvature of tip 70 presents a smooth surface through which the normal or lateral forces act. Frictional forces and contact-carrying member hang-ups are thereby minimized.

The configuration of the contact-carrying spring member meets the conflicting requirements of tolerance accumulation, thermal expansion, multidirectional wipe and allows the use of non-noble contact plating.

The foregoing detailed description has been given for clearness of understanding only, and no unnecessary limitations should be understood therefrom, as some modifications will be obvious to those skilled in the art.

What is claimed is:

1. A contact-carrying spring member to be positioned in an insulating housing for providing an electrical path between a integrated circuit package to a printed circuit board or the like, which comprises, a length of conductive material formed into a generally C-shaped configuration and having an upper and lower flexible beams connected to each other by an arcuate bight with the full extent of the upper beam overlying the lower beam, the lower beam being horizontal with a downwardly projecting jog positioned intermediate the ends, said jog having on its outside surface a contact adapted to engage a circuit on a printed circuit board, the upper beam comprising first and second horizontal sections, said first section being displaced upwardly from said second and integrally joined thereto by a vertical section, said first section having a free end thereon, a contact positioned on the outside surface of the first section adapted to engage a circuit pad on an integrated circuit package which may be positioned on the housing, further, said free end on the first section being rounded so that as a package is loaded into the housing, said upper beam may be deflected downwardly with the rounded free end sliding down a vertical sidewall of the housing.

2. A contact-carrying spring member to be positioned in an insulating housing for providing an electrical path between an integrated circuit package to a printed circuit board or the like, which comprises, a length of conductive material formed into a generally C-shaped configuration and having upper and lower flexible beams connected to each other by an arcuate bight with the full extent of the upper beam overlying the lower beam, the lower beam being horizontal with a downwardly projecting jog positioned intermediate the ends, said jog having on its outside surface a contact adapted to engage a circuit on a printed circuit board, the upper beamm comprising a horizontal section located above the top of the arcuate bight with a curved section connecting the horizontal section to the arcuate bight, said curved section having its convex surface generally facing the lower beam and a part of said curved section extending downwardly from the arcuate bight, said horizontal section having a contact, positioned on its outside surface adapted to engage a circuit pad on an integrated circuit package which may be positioned on the housing.

3. The vertical section of claim 2 wherein the curvature of the curved section describes a radii of about 0.061.

* * * * *